(12) United States Patent
Chen et al.

(10) Patent No.: US 6,181,180 B1
(45) Date of Patent: Jan. 30, 2001

(54) FLIP-FLOP CIRCUIT

(75) Inventors: Zhanping Chen, San Jose, CA (US); Siva G. Narendra, Beaverton, OR (US)

(73) Assignee: Intel Corporation, Santa Clara, CA (US)

( * ) Notice: Under 35 U.S.C. 154(b), the term of this patent shall be extended for 0 days.

(21) Appl. No.: 09/340,417

(22) Filed: Jun. 28, 1999

(51) Int. Cl.[7] .................................................. H03K 3/356
(52) U.S. Cl. ............................................. 327/211; 327/212
(58) Field of Search .................................. 327/200, 201, 327/199, 208, 210–212, 214

(56) References Cited

U.S. PATENT DOCUMENTS

| | | | |
|---|---|---|---|
| 5,764,089 | * | 6/1998 | Partovi et al. ........................ 327/200 |
| 5,898,330 | * | 4/1999 | Klass ..................................... 327/210 |
| 5,900,759 | * | 5/1999 | Tam ...................................... 327/201 |

OTHER PUBLICATIONS

Klass, F., "Semi–Dynamic and Dynamic Flip–Flops with Embedded Logic", *IEEE*, 2 pgs., (1998).

Partovi, H., et al., "Flow–Through Latch and Edge–Triggered Flip–Flop Hybrid Elements", 1996 IEEE International Solid–State Circuits Conference, *1996 Digest of Technical Papers* and *1996 Slide Supplement*, 40 pgs., (1996).

* cited by examiner

*Primary Examiner*—Toan Tran
(74) *Attorney, Agent, or Firm*—Schwegman, Lundberg, Woessner & Kluth, P.A.

(57) ABSTRACT

A low power, high performance flip-flop includes a first branch having a number of transistors connected in series, and a second branch having a number of transistors connected in series. A clock signal and a data input signal are coupleable to the first and second branches of the circuit, the circuit generating a stable logic one or logic zero. The circuit has low power consumption and high performance speed.

21 Claims, 5 Drawing Sheets

FLIP-FLOP CIRCUIT

FIELD

The present invention relates generally to flip-flops, and more specifically to a semi-dynamnic high performance flip-flop.

BACKGROUND

Flip-flops have a wide variety of uses in today's computers and digital circuits. A flip-flop is used to generate a steady state output signal having either a high (logical one) or a low (logical zero) potential. As the uses for flip-flops increase, the desire to improve flip-flop performance and the desire to reduce power consumption has led to increased demand for high performance low power consumption flip-flops. Flip-flops are one of the most commonly used elements to implement sequential circuits, that is circuits in which the primary output relies not only on the current values of the input, but also the previous input values.

A prior art flip-flop 100 is shown in FIG. 1 and comprises p-type transistor 102 and n-type transistors 104, 106, and 108 connected in series between a high potential 110 and ground potential 112, p-type transistor 114 and n-type transistors 116, 118, and 120 connected in series between a high potential 110 and ground potential 112, three inverters 122, p-type transistors 124 and 126, and latch 128. Inverters 122 are coupled in series between clock signal CK and the gate of transistor 108. Clock signal CK is also connected to the gates of transistors 102, 104, and 116. The complement of clock signal CK, signal CK*, is connected to the gates of transistors 120 and 126. A data input D is connected to the gates of transistors 106 and 124. A node 130 is defined at the connection between transistors 102 and 104. Node 130 is also connected to the gates of transistors 114 and 118. Transistors 124 and 126 are connected between high potential 110 and node 130. Latch 128 is connected to node 132 which is between transistors 114 and 116.

The operation of flip-flop 100 is straightforward. In flip-flop 100, when CK is low, node 130 is precharged to high voltage 110, and transistors 108 and 120 are on, while transistors 104 and 116 are off. Node 132 holds its previous value. On the rising edge of clock CK, transistor 102 turns off and transistors 104 and 116 turn on. Transistors 108 and 120 remain on for the delay period of inverters 122. Data input D is sampled in this period. If D is low, node 130 stays high, and output at node 132 either holds low or is pulled low through transistors 116, 118, and 120. If D is high, node 130 is discharged to low through transistors 104, 106, and 108, and output at node 132 holds at high or is pulled high through transistor 114.

Flip-flop 100 has a number of problems. Flip-flop 100 has three transistors 116, 118, and 120 in series which must be activated to discharge a high voltage at node 132 to a low voltage. The more transistors in series, the more time it takes to discharge node 132. This propagation delay is undesirable. Further, flip-flop 100 has a large clock load. Transistors 102, 104, 108, 116, 120, and 126 are all gated to the clock signal CK. This results in increased power consumption over a lighter clock load. Finally, flip-flop 100 has internal node charging and discharging. For example, after the three inverter delay after the clock signal CK switches to a high state, internal node 134 charged to a high state. If data input D is also high, internal node 136 is charged to high. In this case, when the clock switches to low, node 136 starts to discharge. Internal node 134 discharges if D is high. This internal node charging and decharging increases power consumption.

Another prior art flip flop 200 is shown in FIG. 2 and comprises p-type transistor 202 and n-type transistors 204, 206, and 208 connected in series between high potential 210 and ground potential 212, p-type transistor 214 and n-type transistors 216 and 218 connected in series between high potential 210 and ground potential 212, two inverters 220, a NAND gate 222, and latches 224 and 226. Inverters 220 are connected in series between clock signal CK and an input of NAND gate 222. Clock signal CK is also connected to the gates of transistors 202, 208, and 216. Data input D is connected to the gate of transistor 206. A node 228 is defined at the connection between transistors 202 and 204. Node 228 is connected to the gates of transistors 214 and 218, as well as to another input of NAND gate 222 and to latch 224. The output of NAND gate 222 is connected to the gate of transistor 204. Latch 226 is connected to node 230 which is defined between transistors 214 and 216.

The operation of flip-flop 200 is also straightforward. When clock signal CK is at a low state, internal node 228 is precharged to a high voltage, the output from inverters 220 is low, keeping the output of NAND gate 222 high and switching transistor 204 on. Hence, internal node 232 is high. Depending on the data input D, internal node 234 may also be charged high. At the rising edge of clock CK, if D is high, internal nodes 228, 232, and 234 are discharged to pull node 228 to low.

Flip-flop 200 also has a number of problems. Flip-flop 200 has three transistors 204, 206, and 208 in its pull down of node 228. In flip-flop 200, a later signal, the clock signal, is connected to a transistor 208 far from the output. Suppose input D is logic one. When CK is at logic zero, nodes 228, 232, and 234 are all charged. When CK transitions to logic one, nodes 228, 232, and 234 must all be discharged. This discharge of three nodes leads to longer propagation delays and increased energy dissipation.

For the reasons stated above, and for other reasons stated below which will become apparent to those skilled in the art upon reading and understanding the present specification, there is a need in the art for a flip-flop which has reduced power consumption and increased performance.

SUMMARY

A flip-flop according to one embodiment of the invention includes a first branch having a first, p-type, transistor and second, third, and fourth, n-type, transistors, connected in series between a logic one potential and a logic zero potential. Each of the first and second transistors has a gate connection to a clock signal. The third transistor has a gate connection to a data signal. A number of inverters are connected in series between the clock and the gate of the fourth transistor. A second branch of the flip-flop includes a fifth, p-type, transistor and sixth and seventh, n-type, transistors connected in series between the logic one and the logic zero potentials. The sixth transistor has its gate connected to the clock signal. Each of the fifth and seventh transistors has a gate connection to a node defined between the first and second transistors. A first latch circuit is also connected to the node.

Other embodiments are described and claimed.

DESCRIPTION OF THE EMBODIMENTS

In the following detailed description of the embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

Figure 1:
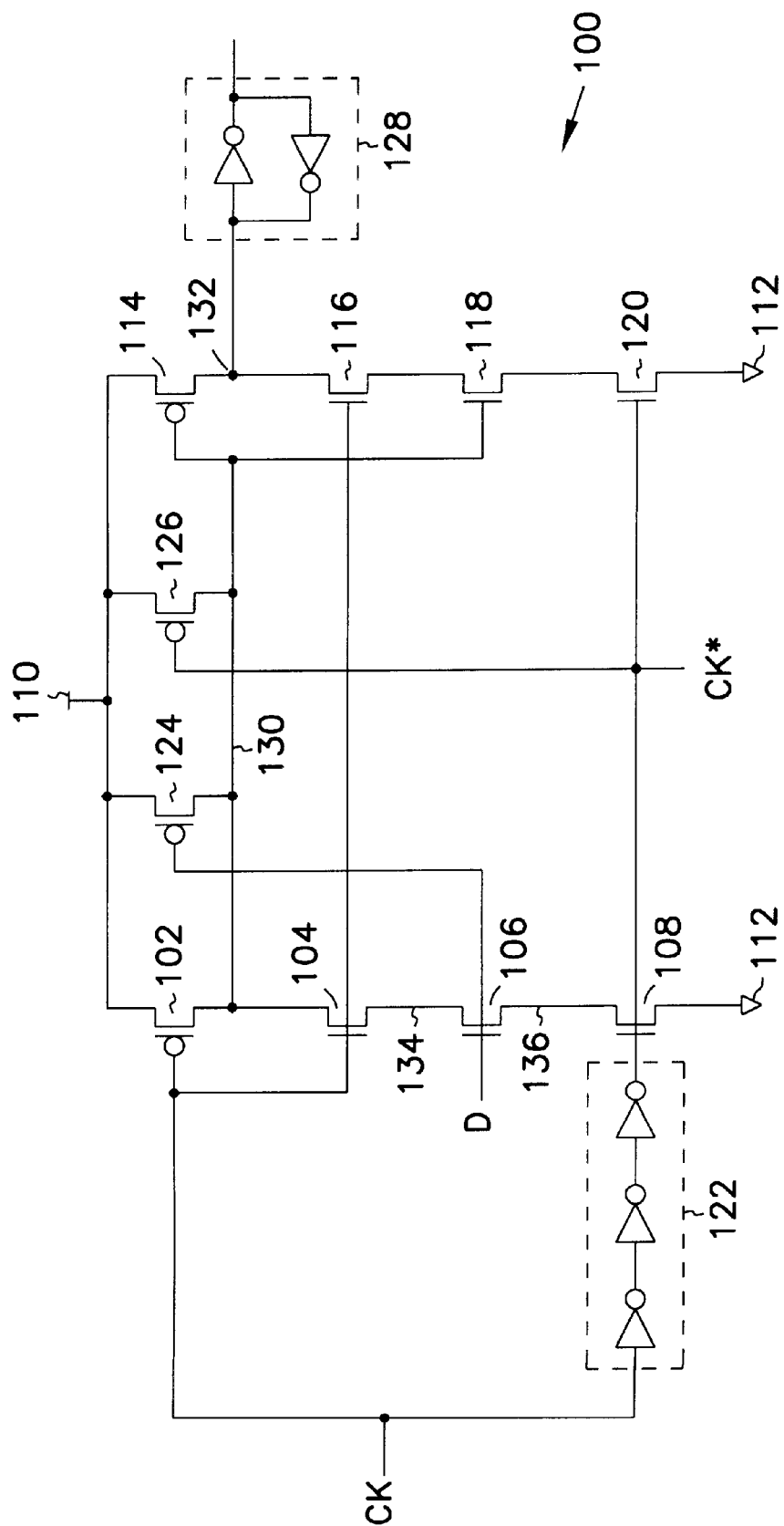
FIG. 1 is a circuit diagram of a prior art flip-flop.
Figure 2:
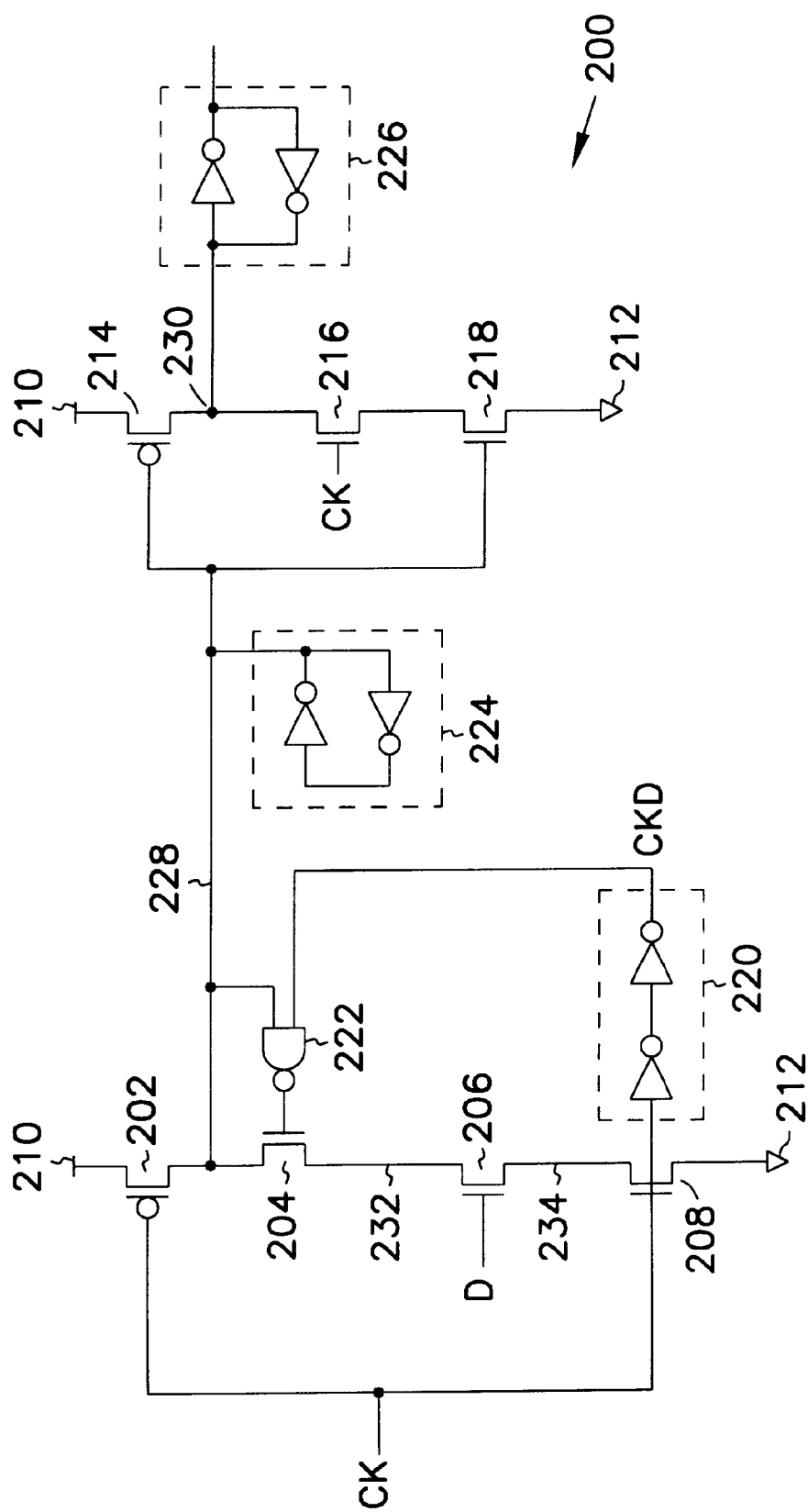
FIG. 2 is a circuit diagram of a second prior art flip-flop.
Figure 3:
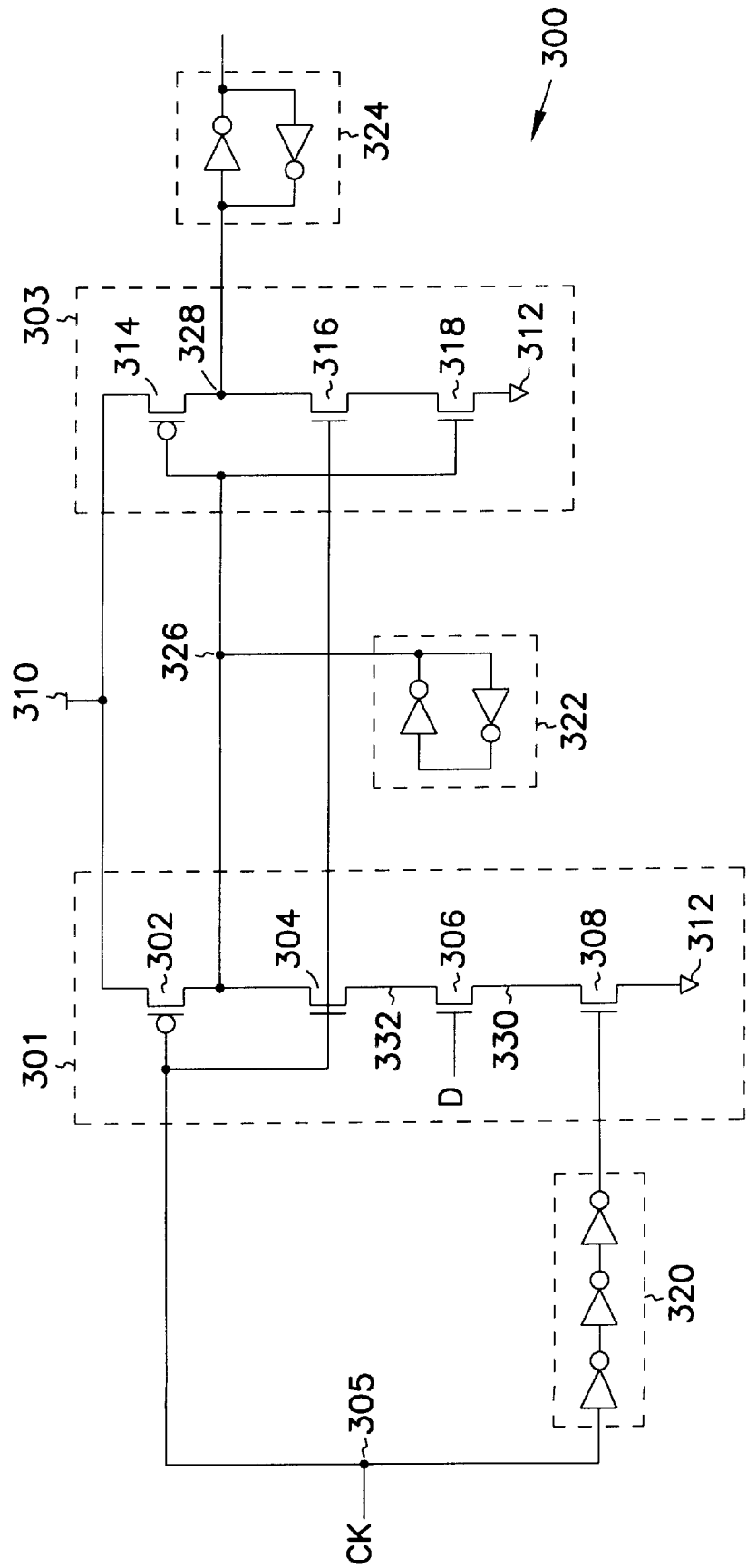
FIG. 3 is a circuit diagram of an embodiment of the invention.

Referring now to FIG. 3, an embodiment 300 of a flip-flop of the present invention comprises a first branch 301 having transistors 302, 304, 306, and 308 connected in series between a first node 310 which is coupled to a high, or logic one, potential, and a second node 312 which is coupled to a low, or logic zero, potential. A second branch 303 is provided and includes transistors 314, 316, and 318 connected in series between node 310 and node 312. A series connection of three inverters 320, and latches 322 and 324, are also provided in the flip-flop circuit. Clock signal CK is coupled to an input node 305, which is connected to the gates of transistors 302, 304, and 316. Inverters 320 are connected in series between node 305 and the gate of transistor 308. Data input D is connected to the gate of transistor 306. Node 326 is defined at the connection between transistors 302 and 304. Node 326 is connected to the gates of transistors 314 and 318, and to latch 322. Node 328 is defined at the connection between transistors 314 and 316. Node 328 is also connected to latch 324.

Latches 322 and 324 in one embodiment comprise back to back connector inverters. In this embodiment, a latch will retain its value even if decoupled from the remainder of the circuit, since the back to back connected inverters will create a loop which will hold the present value at the input of the latch.

Transistors 302 and 314, in one embodiment, are p-type transistor switches which are closed (on) between their source and drain when their gate is at a low potential, and which are open (off) between their source and drain when their gate is at a high potential. Transistors 304, 306, 308, 316, and 318, in one embodiment, are n-type transistor switches which are closed (on) between their source and drain when their gate is at a high potential, and which are open (off) between their source and drain when their gate is at a low potential.

In operation, the flip-flop 300 works as follows. In a pre-charge state, achieved when clock signal CK is in a low state and has been in a low state for a sufficient period of time for all outputs and internal nodes to stabilize at a steady state level, transistors 302 and 308 are on, and transistors 304 and 316 are off. In this pre-charge state, internal node 326 is charged to high potential through transistor 302. Since node 326 is charged high, transistor 314 is off, output node 328 is decoupled, and due to latch 324 holds its previous value. In the pre-charge state, transistor 308 is on, and internal node 330 is pulled to ground 312 through transistor 308. If data input D is high, internal node 332 is also pulled to ground through transistors 306 and 308. As long as data input D remains high for the delay period of the inverters 320, internal node 330 will remain at logic low even if D later changes to high.

Figure 4:
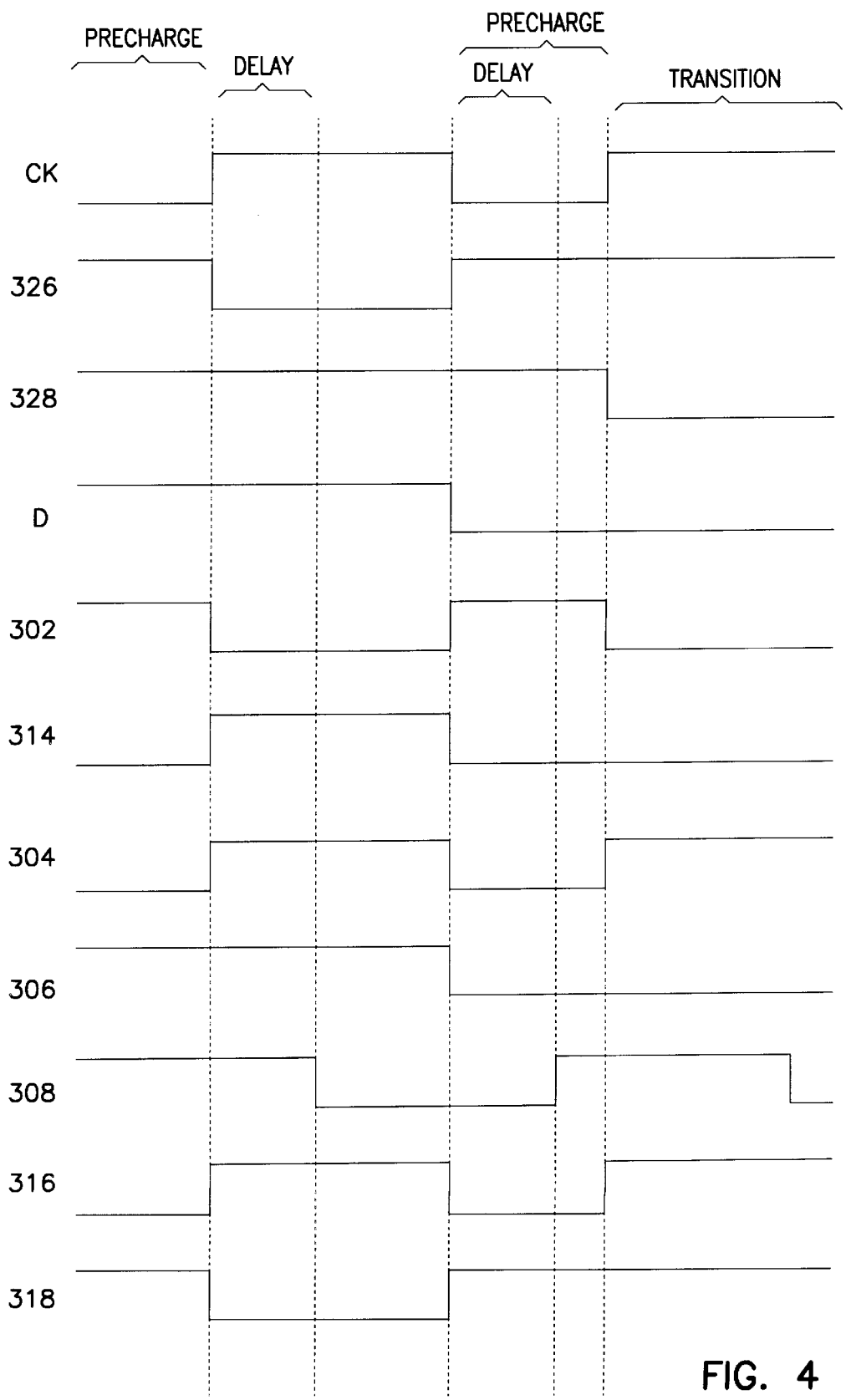
FIG. 4 is a timing diagram of the embodiment of FIG. 3.

A timing diagram for the flip-flop embodiment 300 is shown in FIG. 4. Reference to transistors in the timing diagram refers to whether the transistor is on (indicated as a high in FIG. 4) or off (indicated as a low in FIG. 4). In the pre-charge state, with clock CK in a low state, transistors 302 and 308 are on, and node 326 is charged to a high state. Transistor 318 is also on because node 326 is at a high state. Transistors 304 and 316 are off because clock signal CK is low. Transistor 314 is off because node 326 is at a high state. Output node 328 is decoupled from the remainder of the circuit and holds its previous value due to the back to back connected inverters of latch 324.

On the rising edge of clock CK, transistor 302 turns off, and transistors 304 and 316 turn on. Transistor 308 remains on for the delay period of the three inverters 320, and then shuts off. If data input D is high, node 326 is discharged to logic zero through transistors 304, 306, and 308, and node 312. When internal node 326 discharges to logic zero, the gates of transistors 314 and 318 are pulled to logic zero. When this occurs, transistor 314 turns on, and transistor 318 turns off. This holds output node 328 at logic high, or pulls output node 328 to logic high through transistor 314 and node 310. Node 326 will retain its low value due to the back to back connected inverters of latch 322 as long as transistor 302 remains off. Latch 324 allows output node 328 to maintain its previous value upon decoupling from the remainder of flip-flop 300.

If on the rising clock edge, data input D is low, transistors 304 and 316 will still turn on, and transistor 302 will still turn off. However, internal node 326 will remain at logic high since the discharge path to node 312 is shut off by transistor 306. Transistor 318 will remain on, transistor 314 will remain off, and output node 328 will either hold at logic zero, or be discharged to logic zero through transistors 316 and 318 and node 312. Latch 322 allows internal node 326 to maintain its value upon the rising edge of the clock CK when data input D is low.

The flip-flop embodiment 300 has numerous advantages over the prior art. For example, internal node charging is reduced in the embodiment 300. When D is logic one and CK signal is in a low state, node 326 is pre-charged to high. On the rising clock edge, with D at a high state, node 326 is discharged to a low potential through transistors 304, 306, and 308, and node 312. Node 330 is already at a low potential, and when D is logic one, node 332 is at low potential as well, both of nodes 330 and 332 having been pulled to low potential, node 330 through transistor 308 and node 312, and node 332 through transistors 306 and 308 and node 312. After the three inverter 320 delay, transistor 308 turns off. Internal node 326 remains at low potential due to latch 322. As long as D and CK remain high, nodes 332 and 330 will remain at logic zero.

Depending upon the input sequence, node 332 will remain at logic low or charge share with node 326. When the clock signal CK is at a high state, but data input D is low, node 332 charge shares with node 326. On average, the activities in internal nodes 330 and 332 of the embodiment 300 are lower than the internal nodes 134 and 136 of flip-flop 100, and the internal nodes 232 and 234 of flip-flop 200. The lower activity leads to reduced internal node charging and discharging, creating a circuit with higher performance and lower power consumption.

Another advantage of the embodiment 300 is that only two transistors, 316 and 318, are in the pull down network for the second branch of the flip-flop 300. This reduces the clock load, and leads to smaller propagation delay for the pull down of node 328 to logic zero upon a rising clock edge with D at logic low.

Overall, the flip-flop embodiment 300 has a smaller clock load than flip-flop 100, leading to lower power consumption and improved speed.

The flip-flop embodiment 300 couples the clock signal to a transistor near the output, in this case transistor 304. In flip-flop 200, a later signal, the clock signal, is connected to a transistor 208 far from the output. Suppose input D is logic one. When CK is at logic zero, nodes 326 is charged. When CK transitions to logic one, node 326 must be discharged. However, nodes 330 and 332 are already discharged. When CK transitions to logic one, node 326 will be discharged to logic zero. In the embodiment 300, node 326 will remain at zero due to the inverter loop 322. Nodes 330 and 332 will also remain at zero.

In flip-flop embodiment 300, the late signal (CK) is connected to a transistor, transistor 304, close to node 326, the node which has its potential determined by the first branch 301 of flip-flop 300. Providing the late CK signal to transistor 304 allows the flip-flop 300 to have improved response speed.

By changing the order of the transistors 304, 306, and 308 in the first branch or stage 301 of the embodiment 300, and the transistors 316 and 318 in the second branch or stage 303 of the embodiment 300, another eleven different flip-flip embodiments are realized. These alternative embodiments have the same functional results as the embodiment 300, but have lower performance or higher power consumption than embodiment 300.

For example, if the order of the transistors between transistor 302 and node 312 is altered, a different flip-flop embodiment will result. If the transistor series order from transistor 302 to node 312 is transistor 306, transistor 304, and transistor 308, a different flip-flop embodiment is realized. This new flip-flop, along with ten more flip-flop embodiments, are realized by altering the configuration of transistors 304, 306, and 308 in the first branch of flip-flop 300, and/or by altering the configuration of transistors 316 and 318 in the second branch of flip-flop 300.

Figure 5:
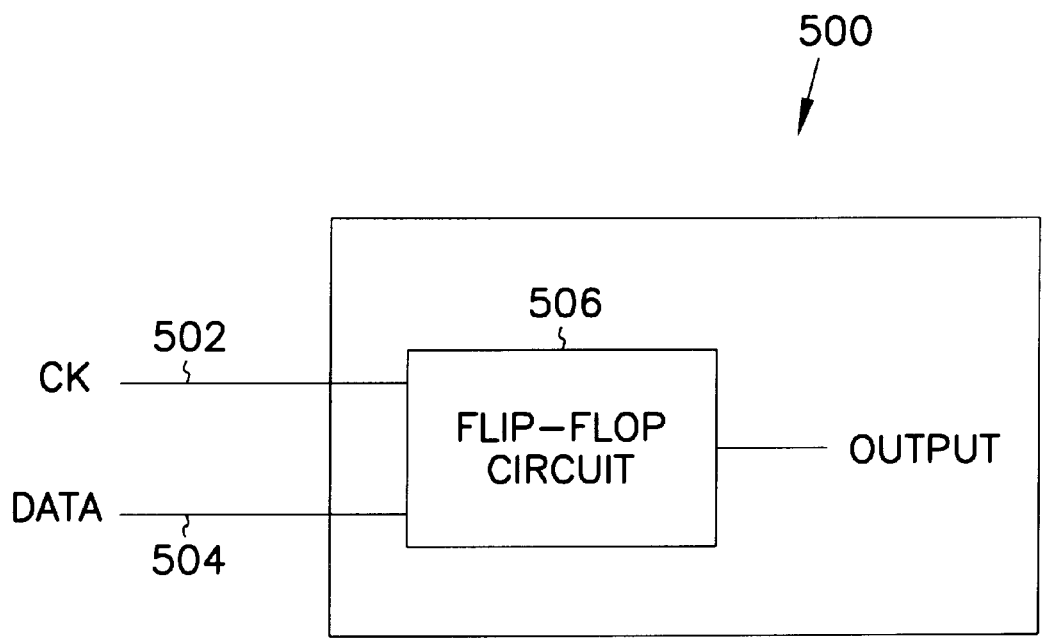
FIG. 5 is a block diagram of an integrated circuit embodiment according to one embodiment of the present invention.

FIG. 5 illustrates a block diagram of an integrated circuit 500 of the present invention. The integrated circuit 500 receives a clock signal 502, and at least one input data signal 504. The clock signal and the input data signal can be coupled to an internal flip-flop circuit 506 for processing by internal circuitry. The flip-flop circuit 506 can be arranged as described above with respect to FIG. 3. The integrated circuit may be any type of integrated circuit, including but not limited to a processor, memory, memory controller, or application-specific integrated circuit (ASIC).

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A flip-flop, comprising:
   a data input node, a clock input node, and a data output node;
   first branch comprising first, second, third, and fourth transistors, the first transistor connected in series between a first node and the second transistor, the second transistor connected in series between the first and third transistors, the third transistor connected in series between the second and fourth transistors, the fourth transistor connected in series between the third transistor and a second node, the first and second transistors each having a gate connected to the clock input node, the third transistor having a gate connected to the data input node, and a plurality of inverters connected in series between the clock input node and the gate of the fourth transistor such that the gate of the fourth transistor receives a signal having a polarity opposite to a signal on the clock input node and delayed relative thereto; and
   a second branch consisting of fifth, sixth, and seventh transistors connected in series between the first node and the second node, the sixth transistor having a gate connected to the third node, the fifth and seventh transistors each having a gate connected to a fourth node defined between the first and second transistors, and the data output node defined between the fifth and sixth transistors.

2. The flip-flop of claim 1, and further comprising:
   a first latch circuit connected to the fourth node.

3. The flip-flop of claim 2, wherein the first latch circuit comprises a pair of inverters connected back to back.

4. The flip-flop of claim 2, and further comprising:
   a second latch circuit connected between the fifth and sixth transistors.

5. The flip-flop of claim 4, wherein the second latch circuit comprises a pair of inverters connected back to back.

6. The flip-flop of claim 1, wherein the number of inverters is three.

7. The flip-flop of claim 1, wherein the sixth and seventh transistors are connected in a different series order between the fifth transistor and the second node.

8. The flip-flop of claim 1, wherein the first and fifth transistors are p-type transistors, and wherein the second, third, fourth, sixth, and seventh transistors are n-type transistors.

9. A flip-flop, comprising:
   a data input node, a clock input node, and a data output node;
   a first branch comprising a first, p-type, transistor and second, third, and fourth, n-type, transistors, connected in series between a first node and a second node such that the first transistor is connected to the first node and the fourth transistor is connected to the second nod, the first and second transistors each having a gate connected to the clock input node, the third transistor having a gate connected to the data input node, and a plurality of inverters connected in series between the clock input node and the gate of the fourth transistor, such that a signal on the gate of the fourth transistor is a logical function of only a signal on the clock input
   a second branch consisting of a fifth, p-type, transistor and sixth and seventh, n-type, transistors connected in series between the first node and the second node, the sixth transistor having a gate connected to the clock input node, the fifth and seventh transistors each having a gate connection to a fourth node defined between the first and second transistors;
   a first latch circuit connected to the fourth node; and
   a second latch circuit connected to the data output node defined between the fifth and sixth transistors.

10. The flip-flop of claim 9, wherein the number of inverters is three.

11. The flip-flop of claim 9, wherein the second and third transistors are connected in a different series order between the first transistor node, and wherein the sixth and seventh transistors are connected in a different series order between the fifth transistor and the second node.

12. An integrated circuit, comprising:
a first input connection for receiving a clock signal;
a second input connection for receiving an input data signal;
a first output connection for producing an output data signal and
a flip-flop circuit coupled to receive the clock signal and the input data signal, the flip-flop comprising:
   a first branch comprising first, second, third, and fourth transistors, connected in series between a first node and a second node such that the fourth transistor is connected to the second node, the first and second transistors each having a gate connected to the first input connection, the third transistor having a gate connected to the second input connection, and a plurality of inverters connected in series between the first input connection and the gate of the fourth transistor such that a signal on the gate of the fourth transistor is a logical function of only a signal on the first input connection; and
   a second branch consisting of fifth, sixth, and seventh transistors connected in series between the first node and the second node, the sixth transistor having a gate connected to the third node, and the fifth and seventh transistors each having a gate connection to a fourth node defined between the first and second transistors, and the first output connection defined between the fifth and sixth transistors.

13. The integrated circuit of claim 12, and further comprising:
a first latch circuit connected to the fourth node.

14. The integrated circuit of claim 13, wherein the first latch circuit comprises a pair of inverters connected back to back.

15. The integrated circuit of claim 13, and further comprising:
a second latch circuit connected between the fifth and sixth transistors.

16. The integrated circuit of claim 15, wherein the second latch circuit comprises a pair of inverters connected back to back.

17. The integrated circuit of claim 12, wherein the number of inverters is three.

18. The integrated circuit of claim 12, wherein the second and third transistors are connected in a different series order between the first transistor and the fourth transistor.

19. The integrated circuit of claim 12, wherein the sixth and seventh transistors are connected in a different series order between the fifth transistor and the second node.

20. The integrated circuit of claim 12, wherein the second and third transistors are connected in a different series order between the first transistor and the fourth transistor, and wherein the sixth and seventh transistors are connected in a different series order between the fifth transistor and the second node.

21. The integrated circuit of claim 12, wherein the first and fifth transistors are p-type transistors, and wherein the second, third, fourth, sixth, and seventh transistors are n-type transistors.

* * * * *

UNITED STATES PATENT AND TRADEMARK OFFICE
CERTIFICATE OF CORRECTION

PATENT NO. : 6,181,180 B1
DATED : January 30, 2001
INVENTOR(S) : Chen et al.

It is certified that error appears in the above-identified patent and that said Letters Patent is hereby corrected as shown below:

Claim 9, column 6,
Line 43, delete "nod," and insert -- node, --, therefor.
Line 50, after "input" insert -- node --.

Claim 11, column 6,
Line 65, insert -- and the second -- after "transistor".

Signed and Sealed this

Twenty-fifth Day of September, 2001

Attest:

*Nicholas P. Godici*

NICHOLAS P. GODICI
*Acting Director of the United States Patent and Trademark Office*

*Attesting Officer*